(12) United States Patent
Dionne

(10) Patent No.: US 6,687,630 B2
(45) Date of Patent: Feb. 3, 2004

(54) LOW LEAKAGE TECHNIQUE FOR DETERMINING POWER SPECTRA OF NON-COHERENTLY SAMPLED DATA

(75) Inventor: Gregory E. Dionne, Arlington, MA (US)

(73) Assignee: Teradyne, Inc., Boston, MA (US)

( * ) Notice: Subject to any disclaimer, the term of this patent is extended or adjusted under 35 U.S.C. 154(b) by 127 days.

(21) Appl. No.: 09/896,788

(22) Filed: Jun. 29, 2001

(65) Prior Publication Data

US 2003/0014203 A1 Jan. 16, 2003

(51) Int. Cl.$^7$ ............................................. G01R 23/00
(52) U.S. Cl. ........................ 702/76; 702/75; 702/112; 324/76.19
(58) Field of Search ............................. 702/76, 66, 70, 702/71, 73–75, 77, 79, 106, 112, 124–126, 183, 189, FOR 103, FOR 104, FOR 107, FOR 108, FOR 110, FOR 168, FOR 170, FOR 171; 324/73.1, 76.19, 76.21, 76.22, 76.15, 76.38, 76.39, 76.41, 76.42, 76.58; 703/2, 13, 14; 341/122, 123; 708/309, 311; 356/451; 700/73, 74

(56) References Cited

U.S. PATENT DOCUMENTS 5,165,051 A * 11/1992 Kumar .................... 324/76.47
5,473,555 A * 12/1995 Potter ......................... 708/313
5,995,914 A * 11/1999 Cabot ......................... 702/109
6,005,664 A    12/1999 Korenberg et al. ......... 356/346
6,137,104 A * 10/2000 Webb et al. ................. 250/226

FOREIGN PATENT DOCUMENTS

EP        0795755       9/1997      ........... G01R/23/16

OTHER PUBLICATIONS

IEEE Std 1057–1994, IEEE, Inc., 345 E. 47$^{th}$ Street, New York, NY 10017, ISBN 1–55937–488–8, Section 4.1.3, 4.1.6, 4.4.4.1.1, Annex A.

* cited by examiner

Primary Examiner—Hal Wachsman
(74) Attorney, Agent, or Firm—Bruce D. Rubenstein (57) ABSTRACT

A technique for determining the amplitudes of frequency components of a waveform sampled from an automatic test system includes assembling a list of N frequencies expected to be found in the sampled waveform. A test program running on the tester generally supplies the list of frequencies. The technique assumes that the sampled waveform conforms to an idealized waveform model that mathematically corresponds to a sum of N sinusoids. Each of the N sinusoids that make up the model has unknown amplitude and a frequency that equals one of the N frequencies in the list of frequencies. The technique attempts to solve for the unknown amplitude of each of the N frequencies by mathematically minimizing, via a linear least-squares algorithm, the difference between the model and the actual, sampled waveform.

21 Claims, 2 Drawing Sheets

LOW LEAKAGE TECHNIQUE FOR DETERMINING POWER SPECTRA OF NON-COHERENTLY SAMPLED DATA

FIELD OF THE INVENTION

This invention relates generally to equipment and methods for testing electronic devices, and more particularly to a technique for extracting from an electronic test signal the amplitudes of the test signal's frequency components.

BACKGROUND OF THE INVENTION

Test programs for automatic test systems commonly require a tester to measure the power spectrum of a signal sampled from a device under test (DUT). In a conventional testing scenario, an automatic test system generates a stimulus for exercising an input of a DUT and samples the output of the DUT as the DUT responds to the stimulus. Tester software computes the power spectrum of the sampled output signal by performing a Discrete Fourier Transform (DFT) on the samples acquired.

As is known, an error called "leakage" manifests itself in power spectra produced by a DFT whenever the sample clock is not "coherent" with the sampled signal. The sample clock is "coherent" if its frequency is a precise integer multiple of each frequencies present in the signal being sampled. Leakage is the mathematical consequence of performing a DFT on truncated frequencies—i.e., frequencies that do not complete a full cycle within the sample window. Leakage can be observed as an erroneous broadening of spectral lines, a creation of false peaks and troughs (lobes), and a general elevation of the power spectrum's noise floor.

Several methods have been devised to reduce leakage. One method is to increase sampling rate. In general, the higher the sampling rate, the smaller the amount of truncation in the frequency range of interest and the smaller the leakage error. Although effective, increasing sampling rate reduces leakage only in proportion to the magnitude of the increase. It also tends to greatly increase the cost of the sampling equipment used.

Another common technique for reducing leakage is to multiply the sampled data sequence by a windowing function. The windowing function has the effect of tapering the sampled data sequence around its endpoints, eliminating discontinuities that can give rise to leakage errors. Different windowing functions can be used, such as Blackman, Hanning, or Hamming windowing functions, each with its own particular characteristics. Windowing functions tend to diminish leakage errors distant from the peaks in a power spectrum, but also tend to create wider peaks. Thus, they have the effect of redistributing rather than completely eliminating leakage. Also, because windowing functions actually change the data on which a DFT is performed, they tend to slightly distort frequency spectra.

Yet another technique is to "resample" the waveform data at a sampling rate that is coherent with the frequencies of the signal being sampled. Resampling works by interpolating between actual points sampled at one rate to mathematically construct a series of points that appear to have been sampled at a different rate. Although resampling can be extremely effective for reducing leakage, it is computationally intensive and its accuracy can suffer from interpolation errors.

Still another technique for reducing leakage is to vary the rate of the sampling clock so that it precisely equals an integer multiple of every frequency found in the sampled signal. This technique is extremely effective, but requires expensive hardware. This approach is particularly expensive when a tester includes a large number of sample clocks, as is often the case.

Manufacturers of automatic test equipment (ATE or "testers") commonly seek to improve their products by providing less costly solutions to conventional testing problems. Great benefits can be gleaned by increasing tester performance while decreasing tester cost. To this end, there is a strong need to provide an inexpensive technique for reducing leakage in the spectra of signals sampled by automatic test systems.

SUMMARY OF THE INVENTION

With the foregoing background in mind, it is an object of the invention to reduce leakage in sampled signals without requiring a significant increase in tester cost.

To achieve the foregoing object, as well as other objectives and advantages, a technique for analyzing the frequency content of a sampled waveform includes assembling a list of N frequencies expected to be found in the sampled waveform. The sampled waveform is assumed to conform to a waveform model that mathematically corresponds to a sum of N sinusoids. Each of the N sinusoids has unknown amplitude and phase, and a frequency that equals a different one of the N frequencies in the list of frequencies. The technique solves for the unknown amplitudes and/or phases that best fit the model to the sampled data.

According to one illustrative embodiment, the technique described above is also used when the frequencies of a sampled waveform are not known in advance. According to this variation, a Fourier Transform is computed on a sampled waveform to produce a rough power spectrum. Peaks in the rough power spectrum are identified, and their frequencies are compiled to form the list of N frequencies. Other factors may be considered in compiling the list of N frequencies, for example, known stimuli to a device from which the sampled data is acquired, and other attendant circumstances. The technique described above is then conducted on the resulting list of N frequencies, to determine the precise amplitudes and/or phases of each of the N sinusoids.

BRIEF DESCRIPTION OF THE DRAWINGS

Additional objects, advantages, and novel features of the invention will become apparent from a consideration of the ensuing description and drawings, in which.

DETAILED DESCRIPTION OF THE PREFERRED EMBODIMENT

Technique

Figure 1:
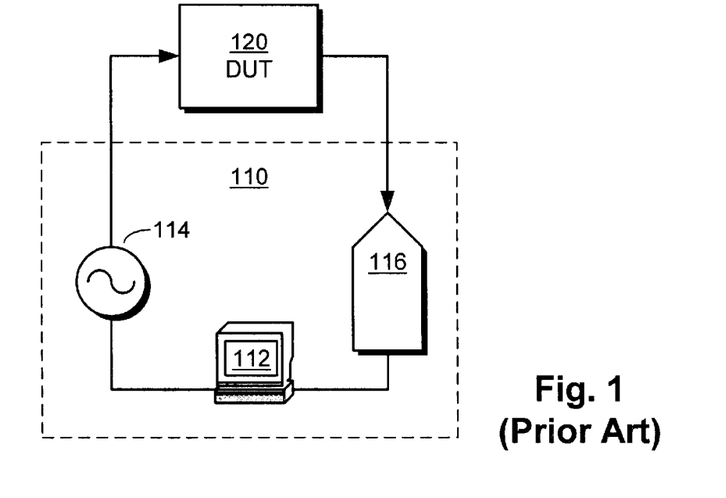
FIG. 1 is a highly simplified schematic of an automatic test system stimulating the input of a device under test and sampling a signal from the output of the device under test.

FIG. 1 is a highly simplified block diagram that shows a conventional configuration for testing a device under test (DUT) 120 with an automatic test system 110. The automatic test system includes a host computer 112. The host computer 112 includes tester software for running test programs. A test program controls the tester's hardware resources for testing a DUT. For example, a test program can control a frequency synthesizer 114 to apply a stimulus to the input of the DUT, and can control a digitizer 116 to sample a response produced at an output of the DUT.

The host computer generally stores sampled data acquired by the digitizer 116 in memory for analysis. The test program, or software routines available to the test program, operates on the sampled data stored to analyze its contents. Conventionally, the test program would direct the tester software to perform a Discrete Fourier Transform (DFT) on the sampled data. The test program would then test the results of the DFT.

Figure 2:
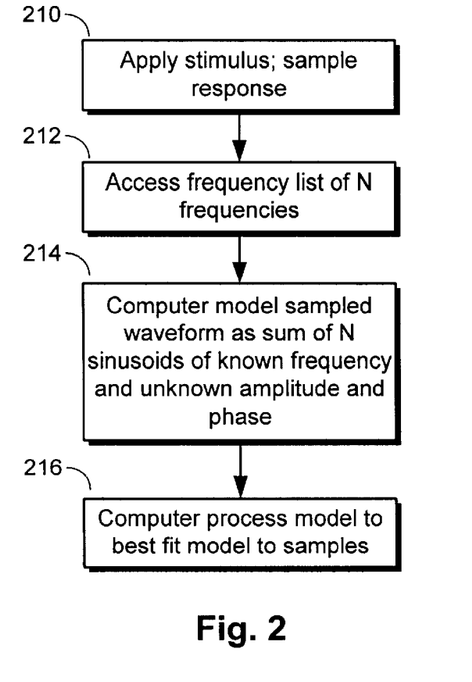
FIG. 2 is a high level flowchart depicting a process according to the invention for determining the amplitudes of frequency components of a waveform sampled from the automatic test system of FIG. 1, when the frequencies of the frequency components are known in advance.

FIG. 2 shows the general process according to the invention for sampling and analyzing test signals in an ATE environment. At step 210, the automatic test system 110 applies a stimulus to an input of the DUT 120.

At step 212, a list of N frequencies is accessed. The N frequencies represent frequencies of the sampled waveform about which amplitude and/or phase information is desired to be known. The number N can be any positive integer. Not all of the N frequencies need actually be present in the sampled waveform. In fact, this technique can be used to test for the presence or absence of any particular frequency component. Preferably, the list of N frequencies is known in advance and stored in the test program.

At step 214, the sampled waveform is computer modeled. The computer model representing the sampled waveform consists of N sinusoids summed together to approximate the actual sampled waveform. Each of the N sinusoids takes the form $$A_k \sin(\omega_k i) + B_k \cos(\omega_k i), \quad (EQ\ 1)$$

where

"$A_k$" and "$B_k$" are unknown coefficients,

"k" is an index that ranges from 1 to N and represents one of the N frequency components, $\omega_k$ corresponds to the $k^{th}$ frequency component (specifically, $\omega_k = 2\pi F_k$, where $F_k$ is the $k^{th}$ frequency), and "i" is an index that identifies a particular sample and corresponds to time.

Although EQ1 appears to be the sum of two sinusoids, it mathematically equates to a single sinusoid having a frequency equal to $\omega_k/2\pi$, an amplitude that equals $\sqrt{A^2k+B^2k}$, and a phase that equals the 2-argument arctangent of $B_k$ and $A_k$.

Given that EQ1 represents each of the N sinusoids in the sampled waveform, the overall sampled waveform can be modeled by the expression $$\sum_{k=1}^{N}(A_k \cos\omega_k i + B_k \sin\omega_k i). \quad (EQ\ 2)$$

At step 216 the waveform model of EQ2 is computer-processed to achieve a best fit between the model and the actual sampled waveform. The preferred embodiment employs a linear least-squares technique to fit the model to the data. In particular, step 216 attempts to minimize the following least-squares estimator:

$$\sum_{i=0}^{M}\left[y_i - \sum_{k=1}^{N}(A_k \cos\omega_k i + B_k \sin\omega_k i)\right]^2, \quad (EQ\ 3)$$

wherein $y_i$ is the $i^{th}$ sampled point of the sampled waveform, and i ranges from 0 to M, where M represents the total number of samples in the sampled waveform.

In order to minimize EQ3, the technique recognizes that a best fit is achieved when the partial derivative of EQ3 equals zero, when taken with respect to each value of $A_k$ and $B_k$. Because there exists a value of $A_k$ and $B_k$ for each of the N frequencies, taking the partial derivative of EQ3 with respect to each of these yields a system of 2N equations:

$$\sum_{i=0}^{M}y_i\cos\omega_j i = \sum_{k=1}^{N}\left(A_k\sum_{i=0}^{M}\cos\omega_k i\cos\omega_j i + B_k\sum_{i=0}^{M}\sin\omega_k i\cos\omega_j i\right) \quad (EQ\ 4)$$

$$\sum_{i=0}^{M}y_i\sin\omega_j i = \sum_{k=1}^{N}\left(A_k\sum_{i=0}^{M}\cos\omega_k i\sin\omega_j i + B_k\sum_{i=0}^{M}\sin\omega_k i\sin\omega_j i\right), \quad (EQ\ 5)$$

where EQ4 and EQ5 are each repeated N times as the index of "j" ranges from 1 to N.

Defining the following coefficients simplifies the description:

$$\text{Let } cc_{kj} = \sum_{i=0}^{M}\cos\omega_k i\cos\omega_j i \quad (EQ\ 6)$$

$$\text{Let } sc_{kj} = \sum_{i=0}^{M}\sin\omega_k i\cos\omega_j i \quad (EQ\ 7)$$

$$\text{Let } cs_{kj} = \sum_{i=0}^{M}\cos\omega_k i\sin\omega_j i \quad (EQ\ 8)$$

$$\text{Let } ss_{kj} = \sum_{i=0}^{M}\sin\omega_k i\sin\omega_j i \quad (EQ\ 9)$$

These coefficients can be mathematically simplified by recognizing that $$cc_{kj} = \left(\sum_{i=0}^{M}\cos(\omega_k + \omega_j)i + \sum_{i=0}^{M}\cos(\omega_k - \omega_j)i\right)\bigg/2$$

$$sc_{kj} = cs_{kj} = \left(\sum_{i=0}^{M}\sin(\omega_k + \omega_j)i + \sum_{i=0}^{M}\sin(\omega_k - \omega_j)i\right)\bigg/2$$

$$ss_{kj} = \left(\sum_{i=0}^{M}\cos(\omega_k + \omega_j)i - \sum_{i=0}^{M}\cos(\omega_k - \omega_j)i\right)\bigg/2,$$

and that $$\sum_{i=0}^{M}\cos\alpha i = (\cos\alpha(N-1) - \cos\alpha N - \cos\alpha + 1)/2(1 - \cos\alpha) \text{ and}$$

$$\sum_{i=0}^{M}\sin\alpha i = (\sin\alpha(N-1) - \sin\alpha N + \sin\alpha)/2(1 - \cos\alpha),$$

wherein $\alpha$ is any arbitrary value of $\omega$.

Rewriting EQ4 and EQ5 using the coefficients defined in EQ6–EQ9 yields the following matrix:

$$V = \begin{pmatrix} \sum_{i=0}^{M} y_i \cos\omega_1 i \\ \sum_{i=0}^{M} y_i \sin\omega_1 i \\ \sum_{i=0}^{M} y_i \cos\omega_2 i \\ \sum_{i=0}^{M} y_i \sin\omega_2 i \\ \sum_{i=0}^{M} y_i \cos\omega_3 i \\ \sum_{i=0}^{M} y_i \sin\omega_3 i \\ \ldots \\ \sum_{i=0}^{M} y_i \cos\omega_N i \\ \sum_{i=0}^{M} y_i \cos\omega_N i \end{pmatrix} = \begin{pmatrix} cc_{11} & sc_{11} & cc_{21} & sc_{21} & \ldots & cc_{N1} & sc_{N1} \\ cs_{11} & ss_{11} & cs_{21} & ss_{21} & \ldots & cs_{N1} & ss_{N1} \\ cc_{12} & sc_{12} & cc_{22} & sc_{22} & \ldots & cc_{N2} & sc_{N2} \\ cs_{12} & ss_{12} & cs_{22} & ss_{22} & \ldots & cs_{N2} & ss_{N2} \\ cc_{13} & sc_{13} & cc_{23} & sc_{23} & \ldots & cc_{N3} & sc_{N3} \\ cs_{13} & ss_{13} & cs_{23} & ss_{23} & \ldots & cs_{N3} & ss_{N3} \\ & & & \ldots & & & \\ cc_{1N} & sc_{1N} & cc_{2N} & sc_{2N} & \ldots & cc_{NN} & sc_{NN} \\ cs_{1N} & ss_{1N} & cs_{2N} & ss_{2N} & \ldots & cs_{NN} & ss_{NN} \end{pmatrix} \begin{pmatrix} A_1 \\ B_1 \\ A_2 \\ B_2 \\ A_3 \\ B_3 \\ \ldots \\ A_N \\ B_N \end{pmatrix} \quad (\text{EQ 10})$$

One can solve EQ10 for each value of $A_k$ and $B_k$ in the ab vector by determining the inverse of the matrix X and multiplying it by the vector V on the left-hand side of EQ10.

Once $A_k$ and $B_k$ are known for each value of k from 1 to N, the amplitude of each $k^{th}$ frequency from the list of frequencies can be determined by computing $\sqrt{A^2_k + B^2_k}$. The value of each phase can be determined by computing the 2-argument ArcTangent of $B_k$ and $A_k$.

The computational burdens imposed by solving EQ10 can be somewhat reduced by imposing a constraint that 2N=M+1 (the number of frequencies is half the number of samples). With this constraint in place, the vector V from EQ10 can be rewritten as follows:

$$\begin{pmatrix} \sum_{i=0}^{M} y_i \cos\omega_1 i \\ \sum_{i=0}^{M} y_i \sin\omega_1 i \\ \sum_{i=0}^{M} y_i \cos\omega_2 i \\ \sum_{i=0}^{M} y_i \sin\omega_2 i \\ \sum_{i=0}^{M} y_i \cos\omega_3 i \\ \sum_{i=0}^{M} y_i \sin\omega_3 i \\ \ldots \\ \sum_{i=0}^{M} y_i \cos\omega_N i \\ \sum_{i=0}^{M} y_i \cos\omega_N i \end{pmatrix} = \begin{pmatrix} \cos 0\omega_1 & \cos 1\omega_1 & \cos 2\omega_1 & \ldots & \cos M\omega_1 \\ \sin 0\omega_1 & \sin 1\omega_1 & \sin 2\omega_1 & \ldots & \sin M\omega_1 \\ \cos 0\omega_2 & \cos 1\omega_2 & \cos 2\omega_2 & \ldots & \cos M\omega_2 \\ \sin 0\omega_2 & \sin 1\omega_2 & \sin 2\omega_2 & \ldots & \sin M\omega_2 \\ \cos 0\omega_3 & \cos 1\omega_3 & \cos 2\omega_3 & \ldots & \cos M\omega_3 \\ \sin 0\omega_3 & \sin 1\omega_3 & \sin 2\omega_3 & \ldots & \sin M\omega_3 \\ & & \ldots & & \\ \cos 0\omega_N & \cos 1\omega_N & \cos 2\omega_N & \ldots & \cos M\omega_N \\ \sin 0\omega_N & \sin 1\omega_N & \sin 2\omega_N & \ldots & \sin M\omega_N \end{pmatrix} \begin{pmatrix} y_0 \\ y_1 \\ y_2 \\ y_3 \\ y_4 \\ y_5 \\ \ldots \\ y_{M-1} \\ y_M \end{pmatrix} \quad (\text{EQ 11})$$

Since imposing the above constraint forces C and $X^{-1}$ to be square matrices of the same rank, EQ10 and EQ11 can be combined to form $$ab = (X^{-1}C)y \quad (\text{EQ12})$$

Thus, it is possible to solve for ab without having to compute V.

The following method is suggested for solving for ab:

First, construct C quickly using the following recurrence relations:

$$\cos(a+1)\omega_k = 2\cos\omega_k \cos a\omega_k - \cos(a-1)\omega_k$$
$$\sin(a+1)\omega_k = 2\cos\omega_k \sin a\omega_k - \sin(a-1)\omega_k$$

Next, compute $X^{-1}$ via L-U decomposition

Apply $X^{-1}$ to C

Compute ab by multiplying X–1C by y

Once $X^{-1}C$ has been constructed, computing ab requires roughly $N^2$ multiply-accumulates.

Preferably, the technique described herein is implemented as a function in a software library. The function preferably receives an input array that stores the list of frequencies and a pointer to the sampled data. The function preferably returns an array containing the values of $A_k$ and $B_k$, from which amplitude and phase can be computed. Alternatively, the function returns amplitude and phase directly. The software library preferably resides on an automatic test system where it is accessible to test programs running on the test system.

Example

Figure 4A:
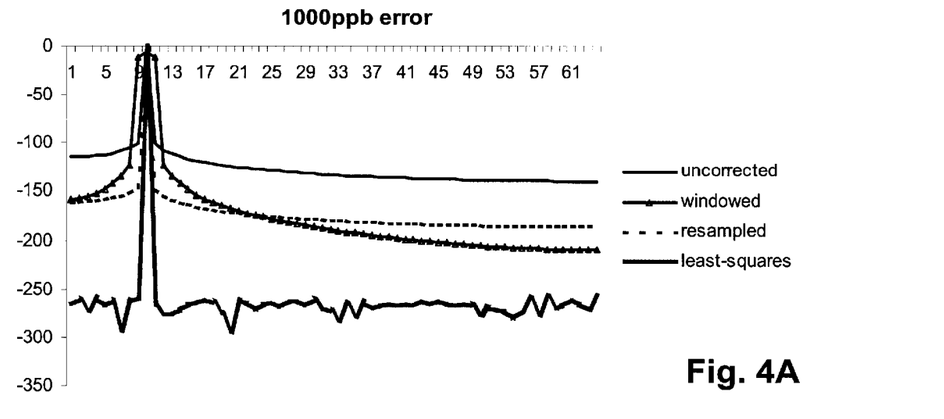
FIGS. 4A–4C are simulated power spectra comparing the performance of different techniques for reducing leakage in response to different simulated errors.
Figure 4B:
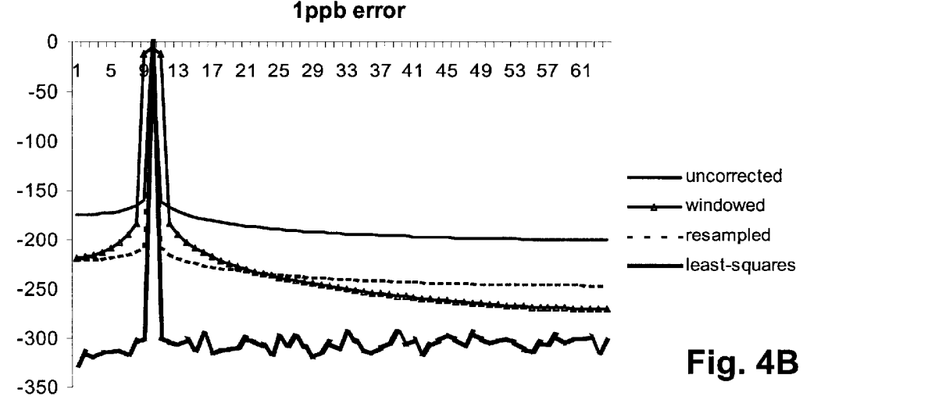
Figure 4C:
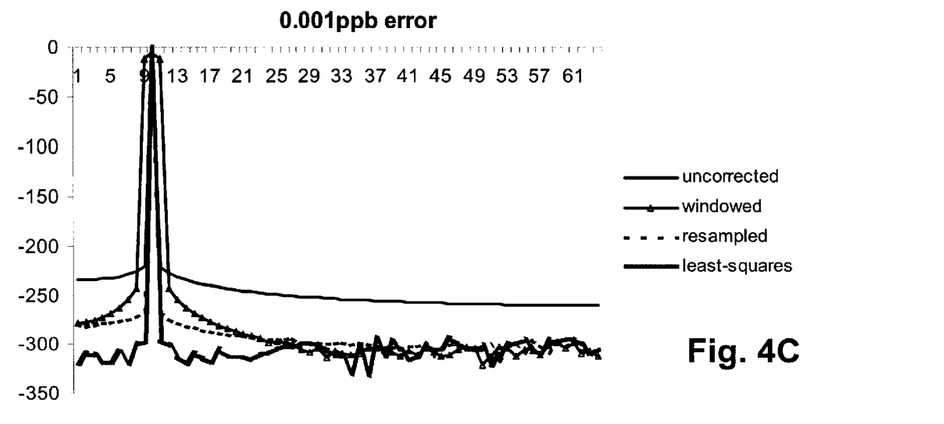

FIGS. 4A–4C illustrate a simulated prediction of the performance of the best-fit technique according to the invention versus other techniques for reducing leakage. A listing of the test code used to produce the data for these charts is provided at the end of the specification. Each of the three graphs of FIGS. 4A–4C compares the power spectrum of a single tone obtained under four different conditions:

1. a Fast Fourier Transform (FFT) of uncorrected data (i.e., acquired with a rectangular window, labeled "uncorrected")
2. an FFT of data shaped by a Hanning window ("windowed"),
3. an FFT of resampled data ("resampled"), and
4. the best-fit technique described herein ("least squares").

The horizontal axis of each graph corresponds to frequency—specifically, frequency bins 0–63. To allow for direct comparisons with methods that employ an FFT, the best fit technique was run with N=64, where each of the N frequencies corresponds to an FFT bin. The vertical axis corresponds to amplitude in db.

Each graph shows a single tone that is slightly askew from the center of the $9^{th}$ frequency bin, i.e., which is not coherently sampled. In particular $\omega_k=2\pi(k-1)(1+\epsilon)$, where $\epsilon=10^{-6}$ for FIG. 4A, $10^{-9}$ for FIG. 4B, and $10^{-12}$ for FIG. 4C. Each of these graphs reveals the strength of the best-fit technique. As compared with the other techniques, the best-fit technique maintains an exceedingly narrow peak without elevated areas ("skirts") surrounding the peak.

Advantages

The disclosed technique offers many advantages over the conventional DFT, particularly in the context of automatic test equipment. Using the technique described, highly accurate spectral analysis can be performed using relatively inexpensive tester electronics. The sample clock need not be coherent with the frequencies to be measured, and spectral leakage is substantially eliminated. As compared with a conventional DFT, in which frequencies are sorted into bins that have finite widths, the technique disclosed does not employ frequency bins but rather discrete frequencies. Thus, the techniques disclosed enable exceedingly closely spaced frequencies to be resolved in a way that would be impossible using a conventional DFT.

The technique is also scalable, because its computation time varies as a function of N—the number of frequencies to be analyzed. Thus, the technique can be performed relatively quickly if only a small number of frequencies is being analyzed. In addition, because the technique employs a best-fit algorithm, it can be used to determine the amplitude and phase of frequency components that do not fully complete a cycle within the sample window. The requirement that frequencies be prescribed in advance does not generally operate as a disadvantage in automatic test equipment, where frequencies produced by a DUT are largely known in advance, and where the tester generates the stimuli for driving the DUT.

Although $X^{-1}C$ requires significant time to compute, it need not be recomputed each time a waveform is analyzed. As long as the frequency list and the number of samples M remains constant, newly acquired sampled can be analyzed by retrieving a stored copy of $X^{-1}C$ and multiplying it by y. Libraries can be provided that include a variety of different $X^{-1}C$ combinations for different frequencies and numbers of samples. Users can select from among the combinations to provide rapid analysis of waveforms.

Alternatives

Having described one embodiment, numerous alternative embodiments or variations can be made.

For example, as described above, the technique for analyzing sampled waveforms is used in the context of automatic test equipment. However, the technique can be more generally applied to any sampled data for which analysis of frequency information is desired. Although the technique is illustrated with respect to the particular test scenario of FIG. 1, it is not limited to any particular test scenario.

The embodiment disclosed herein specifies the use of linear least squares for obtaining a best fit between the waveform model (EQ2) and the actual sampled data. However, other best-fit techniques can be used, such as Cauchy-Lorentz distributions and techniques that attempt to minimize the absolute value of difference between the model and the sampled data. Therefore, the invention is not limited to the use of least-squares.

In addition, the description provides that software be used for manipulating matrices and performing the requisite computations. Alternatively, specialized hardware circuits or processors could be provided to more efficiently perform these functions.

Figure 3:
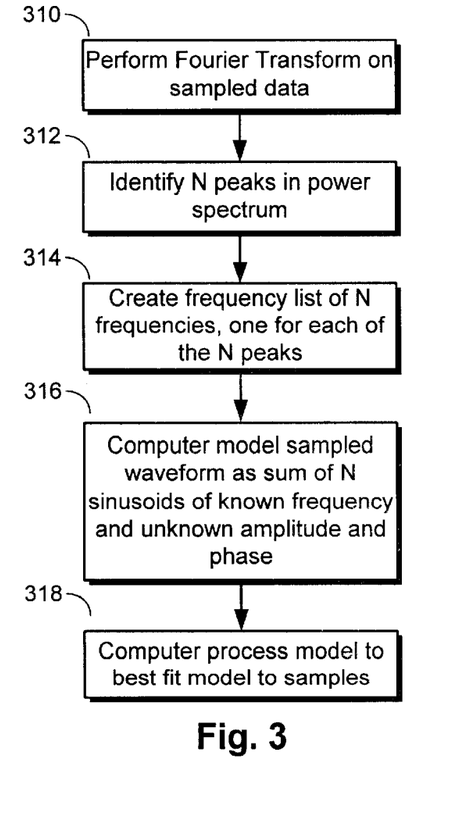
FIG. 3 is a flowchart depicting a process according to the invention for computing a power spectrum of a waveform sampled by the automatic test system of FIG. 1 when the frequency components are not known in advance.

As described above, the technique requires that the list of N frequencies be known in advance. This requirement can be avoided, however, by performing a DFT on the sampled data and examining the results. This variation is illustrated in FIG. 3. At step 310, a DFT is performed. At step 312 peaks are identified in the power spectrum that results from the DFT. The frequencies corresponding to the peaks are then be appended to the list of frequencies for performing a more accurate analysis. Steps 316 and 318 proceed as already described: by assuming that the sampled data conforms to a model and obtaining a best fit between the samples and the model. This technique need not operate in a vacuum. It can also take attendant circumstances into account, such as the frequencies of stimuli applied to the DUT, harmonics of those frequencies, and known characteristics of the DUT.

The technique described above assumes that waveforms are sampled at a uniform rate. However, according to an alternative embodiment, waveforms can be sampled at non-uniform rates. In particular, replacing the discrete index "i" in the equations and matrices above with the term "$t_i$" (i.e., the actual sample times) allows for arbitrarily non-uniform sampling. With non-uniform sampling, the computational simplifications that follow EQ9 may not be used; however, the change is transparent to the remainder of the technique described.

Each of these alternatives and variations, as well as others, has been contemplated by the inventors and is intended to fall within the scope of the instant invention. It should be understood, therefore, that the foregoing description is by way of example, and the invention should be limited only by the spirit and scope of the appended claims.

Computer Listing

A software listing of the test code used to produce the data for these charts is provided below:

```c
/* Standard header files */
#include <stdio.h>
#include <math.h>
#include <sys/time.h>
include <image.h> define N  128
    /* Number of samples of original waveform */
#define M  64
    /* Number of frequency bins for least-squares fit routine */
#define M2 (2*M)
    /* Total number of bins (real, and imaginary) */
#define R 32
    /* Number of samples to expand by in resampling routine */
#define F 1024
    /* Number of samples in filter in resampling routine */ double
    raw_capture[N];  /* The original samples */

/* These are used in the resampling routine only */ double
    extended_capture[2*N],
        /* basically raw_capture[], but with extra samples */
    expanded_capture[R*N],
        /* this is (hopefully) equivalent to raw_capture[] */
        /* but with R times as many samples */
    filter[1024], /* uses a cos^2 filter 1024 points */
    resampled_capture[N];
        /* this is (hopefully) raw_capture[] but sampled at */
        /* the correct rate */ double
    Mx[M2][M2],    /* This corresponds to matrix M */
    Mi[M2][M2],    /* inverse of matrix M */
    MiC[M2][M2],   /* This is the product of M^-1 C */
    x[M2], xmags[M], xargs[M],
```

```
        /* uncorrected dft - mags and phases (arguments) */
xw[M2],xwmags[M],xwargs[M],
        /* uncorrected dft with hamming window */
xs[M2],xsmags[M],xsargs[M],   /* resampled dft */
    xp[M2],xpmags[M],xpargs[M];   /* least squares dft */

/* Computes sum(cos w*i) i=0 to n */ double sumcos(w,n)
double w;
{return w ? 0.5*(cos(w*(n-1))-cos(w*n)-cos(w)+1)/(1-cos(w)) : n;
}

/* Computes sum(sin w*i) i=0 to n */ double sumsin(w,n)
double w;
{return w ? 0.5*(sin(w*(n-1))-sin(w*n)+sin(w))/(1-cos(w)) : 0;
}

/* Makes 1024 point cos^2 filter - used for resampling algorithm */
/* This is not used by least squares */ make_filter()
{int i;
        for (i=0;i<1024;i++)
                filter[i]=(1-cos(2*M_PI*i/1024))/2;
}

/* 1d interpolation routine - used for resampling algorithm */
/* Basically Lagrange's interpolation */
/* This is not used by least squares */
/* tries to return y[a] given y[0]...y[n-1] as input */ double interpolate_1d(a, y, n)
double a, y[];
int n;
{int k, j, xl, xr;
        double product, sum=0;

xl = ftoi(a-2.0);
        xr = ftoi(a+2.0);
```

```
        xl = xl >= 0 ? xl : 0;
        xr = xl <= n ? xr : n;

for(k=xl;k<=xr;k++)
        {product=y[k];
                for(j=xl;j<=xr;j++)
                                if(j!=k)
                                        product*=(a-j)/(k-j);
                sum+=product;
        }
        return sum;
} main()
{int i,j,k,m;
        struct timeval tp0,tp1,tp2,tp3;  /* Used for timing */
        double f0 = 1.0+ 0.001e-9;  /* Frequency error of 0.001ppb */ gettimeofday(&tp0,NULL);
        for (i=0;i<N;i++)
                raw_capture[i]= cos(2*M_PI* 9*f0*i/N);
        gettimeofday(&tp1,NULL);
        printf("Time to construct raw capture: %6uus\n",diff(tp1,tp0));

gettimeofday(&tp0,NULL);
        for (m=0;m<M;m++)
        {x[2*m]=x[2*m+1]=0;
                for (i=0;i<N;i++)
                {x[2*m  ] += raw_capture[i]*cos(2*M_PI*m*i/N);
                        x[2*m+1] += raw_capture[i]*sin(2*M_PI*m*i/N);
        }}
        gettimeofday(&tp1,NULL);
        printf("Time to construct %i-point uncorrected dft: %6uus\n",
          M,diff(tp1,tp0));

for (i=0;i<M;i++)
        {xmags[i]=hypot(x[2*i+1],x[2*i+0])/M;
                xargs[i]=180/M_PI*atan2(x[2*i+1],x[2*i+0]);
        }

/* This section is not least squares fit,
        but is a crude resampling algorithm */ ifdef R
        gettimeofday(&tp0,NULL);
        for (i=0;i<2*N;i++)
```

```
            extended_capture[i]=cos(2*M_PI* 9*f0*(i-N/2)/N);
    gettimeofday(&tp1,NULL);
    printf("Time to construct raw capture (with N/2 padding): %6uus\n",
    diff(tp1,tp0));

gettimeofday(&tp0,NULL);
    make_filter();
gettimeofday(&tp1,NULL);
    printf("Time to construct cos^2 filter: %6uus\n",diff(tp1,tp0));

gettimeofday(&tp0,NULL);
    for (i=0;i<N*R;i++)
    {int e0=N/2-F/R/2+(i+R-1)/R;
        expanded_capture[i]=0;
        for (j=0;j<F/R;j++)
        {int fi=(N*R-i)%R+j*R;
            int ej=e0+j;
            expanded_capture[i] += filter[fi]*extended_capture[ej];
    }}
    gettimeofday(&tp1,NULL);
    printf("Time to expand padded capture: %6uus\n",diff(tp1,tp0));

gettimeofday(&tp1,NULL);
    for (i=0;i<N;i++)
        resampled_capture[i] =
        interpolate_1d(i*R/f0,expanded_capture,N*R);
    gettimeofday(&tp1,NULL);
    printf("Time to resample from expanded capture: %6uus\n",
    diff(tp1,tp0));

gettimeofday(&tp0,NULL);
    for (m=0;m<M;m++)
    {xs[2*m]=xs[2*m+1]=0;
        for (i=0;i<N;i++)
        {xs[2*m  ] += resampled_capture[i]*cos(2*M_PI*m*i/N);
            xs[2*m+1] += resampled_capture[i]*sin(2*M_PI*m*i/N);
    }}
    gettimeofday(&tp1,NULL);
    printf("Time to construct %i-point resampled dft: %6uus\n",
    M,diff(tp1,tp0));

for (i=0;i<M;i++)
    {xsmags[i]=hypot(xs[2*i+1],xs[2*i+0])/M;
        xsargs[i]=180/M_PI*atan2(xs[2*i+1],xs[2*i+0]);
    }
endif /* This section is not least squares fit,
``` but instead uses a hanning window */

```
gettimeofday(&tp0,NULL);
for (m=0;m<M;m++)
{xw[2*m]=xw[2*m+1]=0;
    for (i=0;i<N;i++)
    {xw[2*m  ] += raw_capture[i]*cos(2*M_PI*m*i/N)*
(1-(1+cos(2*M_PI*i/N))/2);
        xw[2*m+1] += raw_capture[i]*sin(2*M_PI*m*i/N)*
(1-(1+cos(2*M_PI*i/N))/2);
}}
gettimeofday(&tp1,NULL);
printf("Time to construct %i-point  windowed dft: %6uus\n",
M,diff(tp1,tp0));

for (i=0;i<M;i++)
{xwmags[i]=hypot(xw[2*i+1],xw[2*i+0])/M;
    xwargs[i]=180/M_PI*atan2(xw[2*i+1],xw[2*i+0]);
}
```

/* The least-squares section */

```
gettimeofday(&tp0,NULL);
for (i=0;i<M;i++)
    for (j=0;j<M;j++)
    {Mx[2*i  ][2*j  ]=0.5*( sumcos(2*M_PI*(i+j)*f0/N,N)+
sumcos(2*M_PI*(i-j)*f0/N,N));
        Mx[2*i  ][2*j+1]=0.5*( sumsin(2*M_PI*(i+j)*f0/N,N)-
sumsin(2*M_PI*(i-j)*f0/N,N));
        Mx[2*i+1][2*j  ]=0.5*( sumsin(2*M_PI*(i+j)*f0/N,N)+
sumsin(2*M_PI*(i-j)*f0/N,N));
        Mx[2*i+1][2*j+1]=0.5*(-sumcos(2*M_PI*(i+j)*f0/N,N)+
sumcos(2*M_PI*(i-j)*f0/N,N));
    }
Mx[1][1]=Mx[0][0]; /* fix that nasty problem with sin */
gettimeofday(&tp1,NULL);
printf("Time to construct matrix: %6uus\n",diff(tp1,tp0));

gettimeofday(&tp0,NULL);
    invert2M();
    gettimeofday(&tp1,NULL);
    printf("Time to invert matrix: %6uus\n",diff(tp1,tp0));

gettimeofday(&tp0,NULL);
    for (i=0;i<M2;i++)
```

What is claimed is:

1. A method of analyzing the frequency components of a sampled signal, comprising:
   (A) creating a list of N different frequency components sought to be analyzed within the sampled signal, N>1, wherein the frequency of each of the N different frequency components is known and the amplitude and phase are unknown;
   (B) modeling the sampled signal as a waveform model that corresponds to a sum of N sinusoids, each of the N sinusoids also having an unknown amplitude and phase, and a frequency that equals one of the frequencies of the N different frequency components; and
   (C) processing the waveform model to best fit the waveform model to the sampled signal.

2. The method as recited in claim 1, wherein step C of processing the waveform model applies a least squares algorithm for fitting the waveform model to the sampled signal.

3. The method as recited in claim 2, wherein each of the N sinusoids can be expressed in the form $A_k \sin\omega_k i + B_k \cos\omega_k i$, wherein
   "$A_k$" and "$B_k$" are unknown coefficients,
   "k" is an index that ranges from 1 to N and represents one of the N different frequency components,
   "$107_k$" corresponds to the $k^{th}$ frequency component, and
   "i" is an index that identifies a particular sample and corresponds to time.

4. The method as recited in claim 3, wherein the step C of processing the waveform model minimizes an estimator that can be expressed as $$\sum_{i=0}^{M}\left[y_i - \sum_{k=1}^{N}(A_k \cos\omega_k i + B_k \sin\omega_k i)\right]^2,$$

wherein
   "M" corresponds to a number of samples that makes up the sampled signal, and
   "$y_i$" represents the $i^{th}$ point of the sampled signal.

5. The method as recited in claim 1, further comprising solving for at least one of the unknown amplitudes and phases of the N different frequency components.

6. The method as recited in claim 5, wherein each of the N different frequency components takes the form $$A_k \sin(\omega_k i) + B_k \cos(\omega_k i), \text{ and}$$

the amplitude of each $k^{th}$ of the N different frequency components can be expressed as $$\sqrt{A^2_k + B^2_k},$$

wherein
   "$A_k$" and "$B_k$" are unknown coefficients,
   "k" is an index that ranges from 1 to N and represents one of the N different frequency components,
   $\omega_k$ corresponds to a $k^{th}$ frequency component (specifically, $\omega_k = 2\pi F_k$, where $F_k$ is a $k^{th}$ frequency), and
   "i" is an index that identifies a particular sample and corresponds to time.

7. The method as recited in claim 5, wherein the phase of each $k^{th}$ of the N different frequency components can be expressed as the 2-argument arctangent of $B_k$ and $A_k$.

8. The method as recited in claim 1, wherein the sampled signal is sampled at a non-uniform rate.

9. A method of testing a device under test in an automatic test system, comprising:
   (A) applying a stimulus signal to the device under test;
   (B) sampling a response signal from the device under test;
   (C) creating a list of N different frequency components sought to be analyzed within the sampled response signal, N>1, wherein the frequency of each of the N different frequency components is known and the amplitude and phase are unknown;
   (D) computer modeling the sampled response signal as a waveform model that corresponds to a sum of N sinusoids, each of the N sinusoids also having an unknown amplitude and phase, and a frequency that equals a different one of the frequencies of the plurality of N different frequency components;
   (E) computer processing the waveform model to best fit the waveform model to the sampled response signal; and
   (F) solving for at least one of the unknown amplitudes and phases of the N different frequency components.

10. The method as recited in claim 9, wherein the device is tested as part of a manufacturing process for ensuring quality of the device prior to shipment.

11. The method as recited in claim 9, wherein the step C of creating the list of N different frequency components comprises:
    providing with the list of N different frequency components a frequency of a stimulus signal applied to the device under test.

12. The method as recited in claim 11, further comprising:
    providing with the list of N different frequency components harmonics of the frequency of the stimulus signal applied to the device under test.

13. The method as recited in claim 9, wherein the step C of creating the list of N different frequency components comprises:
    performing a Discrete Fourier Transform (DFT) on the sampled response signal;
    identifying peaks in the DFT; and
    adding to the list of N different frequency components frequencies substantially equal to the peaks in the DFT.

14. In an automatic test system, an apparatus for analyzing the frequency content of test signals, comprising:
    a digitizer for sampling a test signal from a device under test;
    a memory for storing a list of N different frequency components sought to be analyzed within the sampled test signal, N>1, wherein the frequency of each of the N different frequency components is known and the amplitude and phase are unknown;
    software for computer modeling the sampled test signal as a waveform model that corresponds to a sum of N sinusoids, each of the N sinusoids also having an unknown amplitude and phase, and a frequency that equals a different one of the N different frequency components; and
    software for computer processing the waveform model to best fit the waveform model to the sampled test signal.

15. The apparatus as recited in claim 14, further comprising a test program that runs on the automatic test system and prescribes the frequencies in the list of N different frequency components.

16. The apparatus as recited in claim 14, wherein the software for computer modeling and the software for computer processing reside in a software library that is accessible by different test programs for analyzing sampled waveforms.

17. The apparatus as recited in claim 14, wherein the software for computer processing applies a least squares algorithm for fitting the waveform model to the sampled test signal.

18. The apparatus as recited in claim 17, wherein each of the N sinusoids can be expressed in the form $A_k \sin \omega_k i + B_k \cos \omega_k i$, wherein "$A_k$" and "$B_k$" are unknown coefficients, "k" is an index that ranges from 1 to N and represents one of the N different frequency components, $\omega_k$ corresponds to the $k^{th}$ frequency component, and "i" is an index that corresponds to time.

19. The apparatus as recited in claim 18, wherein the software for computer processing minimizes an estimator that can be expressed as $$\sum_{i=0}^{M} \left[ y_i - \sum_{k=1}^{N} (A_k \cos\omega_k i + B_k \sin\omega_k i) \right]^2,$$

wherein

"M" represents a number of samples that make up the sampled test signal, and

"$y_i$" represents the $i^{th}$ point of the sampled test signal.

20. In an automatic test system, an apparatus for analyzing the frequency content of test signals, comprising:

a digitizer for sampling a test signal from a device under test;

means for storing a list of N different frequency components sought to be analyzed within the sampled test signal, N>1, wherein the frequency of each of the N different frequency components is known and the amplitude and phase are unknown;

means for modeling the sampled test signal as a waveform model that corresponds to a sum of N sinusoids, each of the N sinusoids also having an unknown amplitude and phase, and a frequency that equals one of the frequencies of the N different frequency components; and means for processing the waveform model to best fit the waveform model to the sampled test signal.

21. The apparatus as recited in claim 20, wherein the means for modeling and the means for processing reside in a software library that is accessible by different test programs for analyzing sampled test signals.

* * * * *